United States Patent [19]
Saito

[11] Patent Number: 6,107,005
[45] Date of Patent: Aug. 22, 2000

[54] METHOD OF APPLICATION OF A THIN FILM MAGNETIC HEAD INCLUDING A NEGATIVE PHOTORESIST

[75] Inventor: Mikiko Saito, Tokyo, Japan

[73] Assignee: NEC Corporation, Tokyo, Japan

[21] Appl. No.: 09/161,417

[22] Filed: Sep. 24, 1998

Related U.S. Application Data

[62] Division of application No. 08/851,457, May 5, 1997, Pat. No. 5,877,924.

[30] Foreign Application Priority Data

May 8, 1996 [JP] Japan .................................... 8-112871

[51] Int. Cl.$^7$ ................. G03F 7/00; G03F 7/40
[52] U.S. Cl. ................... 430/320; 430/312; 430/319; 430/324; 430/328; 430/330; 360/126
[58] Field of Search .................. 430/320, 324, 430/328, 319, 330, 312; 360/126

[56] References Cited

U.S. PATENT DOCUMENTS

| | | | |
|---|---|---|---|
| 4,933,209 | 6/1990 | Anthony | 427/116 |
| 5,045,961 | 9/1991 | Kobayashi | 360/126 |
| 5,448,822 | 9/1995 | Wu | 29/603 |

FOREIGN PATENT DOCUMENTS 2254615  10/1990  Japan .

OTHER PUBLICATIONS

C.A. Cortellino et al., "Photoresist for Use in Silicon Nitride Etching Baths", *IBM Technical Disclosure Bulletin*, vol. 14, No. 8, Jan. 1972, p. 2309.

*Primary Examiner*—Kathleen Duda
*Assistant Examiner*—Nicole Barreca
*Attorney, Agent, or Firm*—Sughrue, Mion, Zinn, Macpeak & Seas, PLLC

[57] ABSTRACT

A thin film magnetic head is capable of providing sufficient characteristics as an interlayer insulation layer even when a low temperature heat treatment is performed, and improving throughput of a process. The thin film magnetic head is fabricated by forming a protective layer 2 on a substrate 1, forming a lower shield 3 on the protective layer 2, forming a reading MR portion 4 on the lower shield 3, and forming an insulation layer 5 as a gap layer. A soft magnetic material layer of permalloy is formed as a common pole 6. On the common pole 6, a negative type photoresist 7 is applied. A patterning is performed by irradiating a light via an insulation layer pattern mask 9 and performing etching by a developer. Then, heat treatment is performed at a temperature lower than or equal to 200° C. under inert atmosphere to form an interlayer insulation layer. Over this, a coil 8 is formed. In order to save a step, a negative type photoresist 7 is applied to form an interlayer insulation layer.

25 Claims, 5 Drawing Sheets

METHOD OF APPLICATION OF A THIN FILM MAGNETIC HEAD INCLUDING A NEGATIVE PHOTORESIST

This is a divisional of application Ser. No. 08/851,457, now U.S. Pat. No. 5,877,924 filed May 5, 1997, the disclosure of which is incorporated herein by reference.

BACKGROUND OF THE INVENTION

1. Field of the Invention

The present invention relates to a thin film magnetic head and fabrication process therefor. More specifically, the invention relates to a thin film magnetic head to be employed in a magnetic recording apparatus, such as a magnetic disk apparatus.

2. Description of the Related Art

Conventionally, in such kind of thin film magnetic head, a protective film 12, a lower shield 13, a reading MR (magnetic resistor) 14, a common pole (lower magnetic body) 15, an insulation film, a photoresist layer 17 and a coil 18 are formed on a substrate 11 in sequential order, a light is irradiated on the photoresist layer 17 via a mask 19 (see FIG. 5A) to perform patterning of the photoresist layer 17, as shown in FIG. 5.

After patterning of the photoresist layer 17, heat treatment is performed for hard-baked the photoresist layer (interlayer insulation layer) 20 (see FIG. 5B), and the upper magnetic body 10 and a protective layer are formed thereon. The interlayer insulation layer 20 is intended to provide insulation between the conductor coils or between the magnetic layer and the conductor coil and also to reduce step height of the magnetic layer and the conductor coil.

Here, as shown in "PHOTORESIST FOR USE IN SILICON ETCHING BATHS" (IBM Technical Disclosure Bulletin Vol. 14, No. 8, p. 2309, 1972), for example, there is a method to employ a positive type photoresist of novolac resin type as an insulation layer.

In this case, after applying a positive type photoresist over the entire surface by way of a spin coating method or so forth, an ultraviolet ray is irradiated except for the portion to be left as an insulation layer and development is performed with an alkali aqueous solution to form a pattern of the insulation layer (see FIG. 5A).

The photoresist pattern of the insulation layer is required to be stably present even after the subsequent processes, baking is effected at a temperature higher than or equal to 250° C. to form the interlayer insulation layer 20 (see FIG. 5B).

On the organic insulation layer, the upper magnetic core layer is formed. The protective layer is formed thereover by way of sputtering (see FIG. 5B) to complete the thin film composite magnetic head. Concerning the fabrication process, there is a technology disclosed, for example, in Japanese Unexamined Patent Publication (Kokai) No. Heisei 2-254615.

In the conventional fabrication process of the thin film magnetic head as set forth above, for a baking temperature higher than or equal to 250° C. of the hard-baked photoresist, stability against heat is required for material forming the respective head. However, in the spin valve head material attracting attention as a high density MR head material, stability against such temperature is not always sufficient.

Therefore, it is required to develop a process that can be performed at lower temperature. However, the positive type novolac resin is low in thermal stability and has a low softening point. Therefore, a high temperature baking process has to be provided in order to attain stability at high temperature.

On the other hand, an apex in the direction of section of the interlayer insulation layer has to be optimized in view of recording characteristics. Conventionally, the apex is set on the basis of the heat treatment condition and viscosity of the resist material, and thus width in selection is narrow and setting of the process is difficult.

SUMMARY OF THE INVENTION

Therefore, it is an object of the present invention to provide a thin film magnetic head which can solve the above-mentioned problems and thus can obtain satisfactory characteristics as an interlayer insulation layer even when a low temperature heat treatment process is employed.

In order to accomplish the above-mentioned object, a thin film magnetic head comprises:

a lower magnetic material layer and an upper magnetic material layer forming a magnetic circuit;

a coil disposed between the lower magnetic material layer and an upper magnetic material layer; and a hard-baked negative type photoresist layer formed between the lower magnetic material layer and the upper magnetic material layer together with the coil.

In the construction set forth above, the negative type photoresist may contain 1,1-bis[p-chlorophenyl]-2,2,2-trichloroethane, its isomer, analogue, homologue and residual compound which has maximum absorption around 250 nm.

The negative type photoresist exposure may be performed by irradiation of light employing one of an electron beam, light having a short wavelength from a high pressure mercury lamp and a wide range wavelength light. The negative type photoresist may be subjected to irradiation of light by depressing a mask which has a transfer pattern to form the apex of the negative type photoresist to have a predetermined angle.

In the alternative, a thin film magnetic head comprising:

a lower magnetic material layer and an upper magnetic material layer forming a magnetic circuit;

a coil disposed between the lower magnetic material layer and an upper magnetic material layer; and a hard-baked negative type photoresist layer formed between the lower magnetic material layer and the upper magnetic material layer together with the coil and formed of a negative type photoresist which is cured by irradiation of light, and the negative type photoresist layer containing one of 1,2,5,6,9,10-hexabromocyclododecane, its isomer, analogue, homologue and residual compound; 1,10-dichlorododecane, its isomer, analogue, homologue and residual compound; 1,1-bis[p-chlorophenyl]-2,2-dichloroethane, its isomer, analogue, homologue and residual compound; 1,1-bis[p-chlorophenyl]-2,2-dichloroethylene, its isomer, analogue, homologue and residual compound; and 1,2,3,4,5,6-hexachlorocyclohexane, its isomer, analogue, homologue and residual compound.

According to a further aspect of the invention, there is a fabrication process for a thin film magnetic head having a structure, in which a coil and a hard-baked negative type photoresist are disposed between a lower magnetic material layer and an upper magnetic material layer comprising:

forming a lower magnetic material layer;

applying a negative type photoresist which is cured by irradiation of a light on the lower magnetic material layer;

irradiating a light on the negative type photoresist through a preliminarily set mask;

performing a heat treatment for the negative type photoresist by irradiation of the light to form the hard-baked photoresist;

forming the coil on the hard-baked negative type photoresist;

applying a negative type photoresist on the coil;

irradiating a light on the negative type photoresist via the mask;

performing a heat treatment for the negative type photoresist by irradiation of light to form the hard-baked negative type photoresist; and forming the upper magnetic material layer on the hard-baked negative type photoresist.

The negative type photoresist 7 may contain 0.1 to 5% of 1,1-bis[p-chlorophenyl]-2,2,2-trichloroethane, its isomer, analogue, homologue and residual compound which has maximum absorption around 250 nm.

The negative type photoresist exposure may be exposed by irradiation by one of short wavelength light employing at least one of an electron beam and high pressure mercury, and a light of wide range wavelength.

The negative type photoresist may be subjected to irradiation of light by depressing a mask which has a transfer pattern to form the apex of the hard-baked negative type photoresist to have a predetermined angle.

In the alternative, a fabrication process for a thin film magnetic head having a structure, in which a coil and a hard-baked negative type photoresist are disposed between a lower magnetic material layer and an upper magnetic material layer comprises:

forming a lower magnetic material layer;

applying a negative type photoresist which is cured by irradiation of a light on the lower magnetic material layer;

irradiating a light on the negative type photoresist through a preliminarily set mask;

performing a heat treatment for the negative type photoresist by irradiation of light to form the hard-baked negative type photoresist;

forming the coil on the hard-baked negative type photoresist;

applying a negative type photoresist on the coil;

irradiating a light on the negative type photoresist via the mask;

performing a heat treatment for the negative type photoresist by irradiation of light to form the hard-baked photoresist; and forming the upper magnetic material layer on the hard-baked negative type photoresist, the negative type photoresist layer containing one of 1,2,5,6,9,10-hexabromocyclododecane, its isomer, analogue, homologue and residual compound; 1,10-dichlorododecane, its isomer, analogue, homologue and residual compound; 1,1-bis[p-chlorophenyl]-2,2-dichloroethane, its isomer, analogue, homologue and residual compound; 1,1-bis[p-chlorophenyl]-2,2-dichloroethylene, its isomer, analogue, homologue and residual compound; and 1,2,3,4,5,6-hexachlorocyclohexane, its isomer, analogue, homologue and residual compound.

BRIEF DESCRIPTION OF THE DRAWING

The present invention will be understood more fully from the detailed description given hereinafter and from the accompanying drawings of the preferred embodiment of the present invention, which, however, should not be taken to be limitations to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

At first operation of the present invention will be explained hereinafter.

As a hard-baked negative type photoresist layer disposed between a lower magnetic material layer and an upper magnetic material layer forming a magnetic circuit, a negative type photoresist which is cured by irradiation of light, is employed.

By this, the interlayer insulation layer with improved bridging density can be obtained. As a result, a highly reliable interlayer insulation layer having small thermal expansion and shrinking variation in heat treatment can be obtained after curing.

On the other hand, by enabling low temperature heat treatment at lower than or equal to 200° C. which is much lower than the conventional heat treatment temperature of higher than or equal to 250° C., a spin valve heat material which has not been possible to employ in the prior art, becomes possible to employ.

Furthermore, the heat treatment can be performed a lower temperature than that in the prior art and throughput of the process can be improved to permit lowering of the cost. Therefore, even when low temperature heat treatment is employed, satisfactory characteristics of the interlayer insulation layer can be obtained. Consequently throughput of the process can be improved.

Namely, in the present invention, in order to obtain satisfactory characteristics of the interlayer insulation layer even with low temperature heat treatment at lower than or equal to 200° C. for the photoresist, and to sufficiently cure the interlayer insulation layer, a device employing a broader wavelength source containing shorter wavelength than the wavelength of the light to be irradiated under normal exposure condition (high power ultraviolet ray irradiation device) is used for promoting curing.

Figure 1:
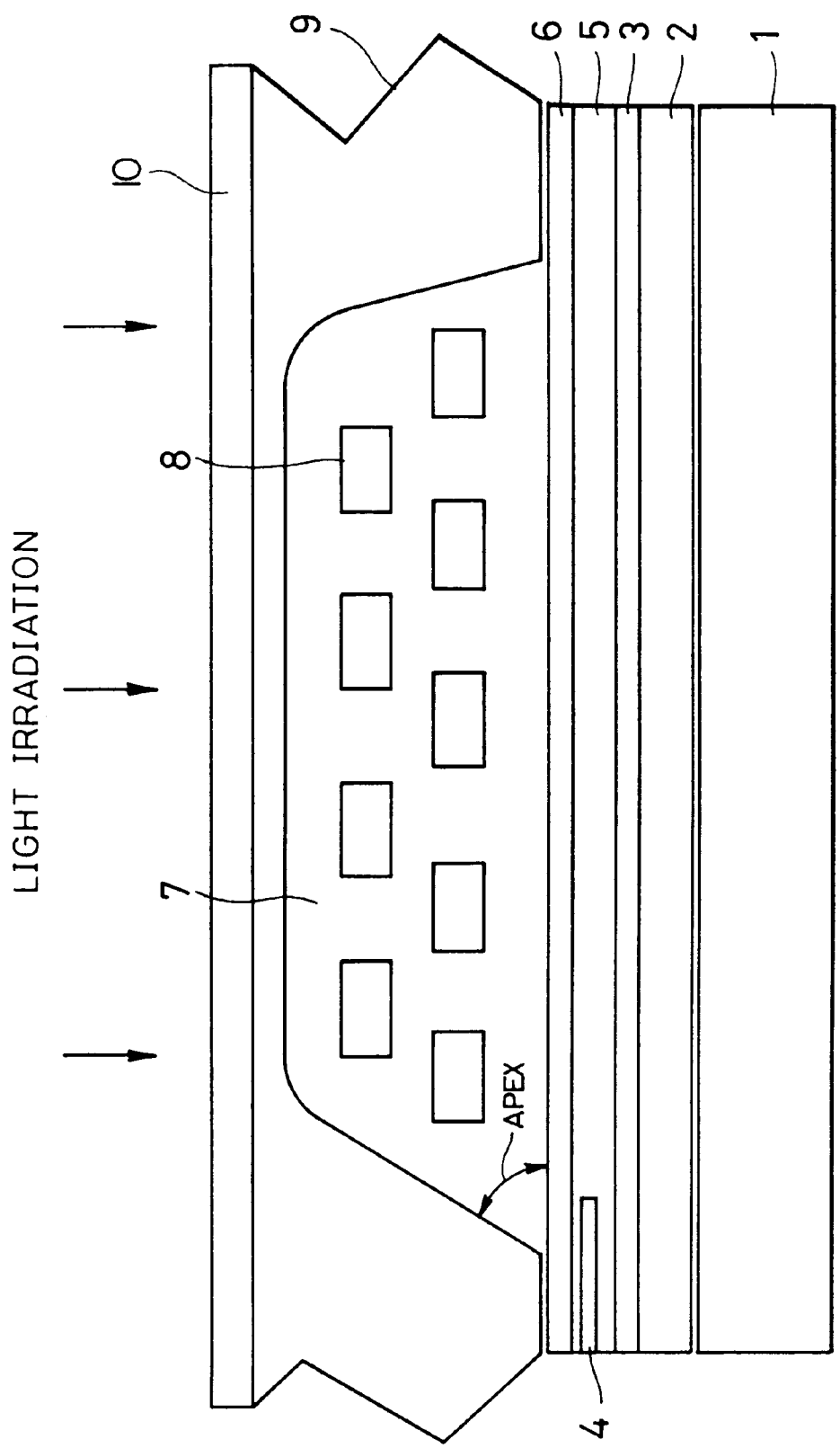
FIG. 1 is an illustration showing one embodiment of a thin film magnetic head according to the present invention.
Figure 2:
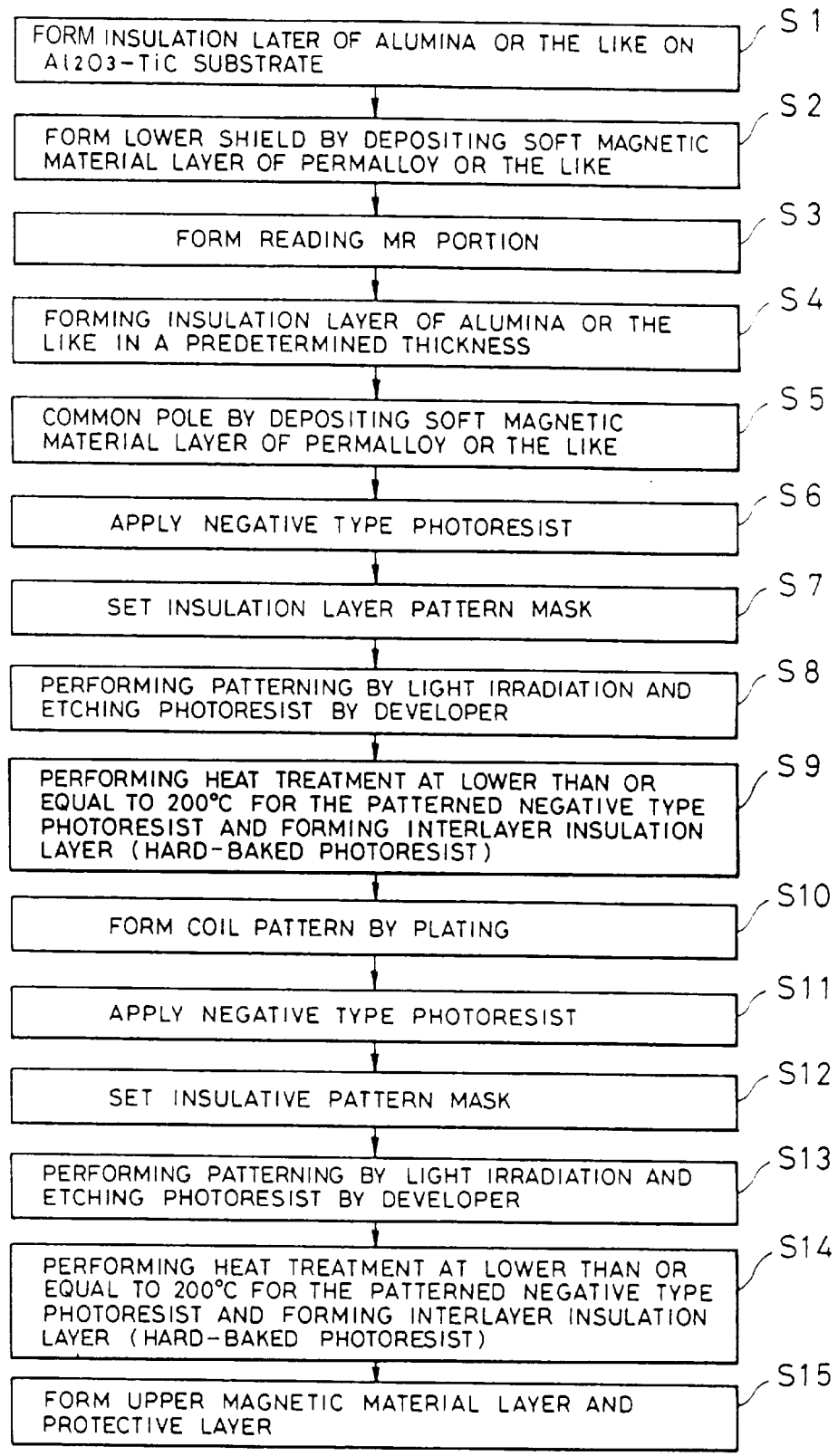
FIG. 2 is an illustration showing one embodiment of a fabrication process of the thin film magnetic head according to the present invention.

Next, the preferred embodiments of the present invention will be discussed with reference to the drawings, particularly to FIGS. 1 to 4. FIG. 1 is an illustration showing one embodiment of a thin film magnetic head according to the present invention, and FIG. 2 is an illustration showing one embodiment of a fabrication process of the thin film magnetic head according to the present invention. One embodiment of the fabrication process of the thin film magnetic head according to the present invention will be discussed with reference to FIGS. 1 and 2.

When one embodiment of a thin film magnetic head is to be fabricated, a protective layer (insulation layer) 2 of alumina or the like is formed on an $Al_2O_3$—TiC substrate 1 by way of sputtering or other appropriate method (step S1 of FIG. 2). Then, a soft magnetic material layer of permalloy or the like is deposited by way of sputtering, plating or so forth to form a lower shield 3 (step S2 of FIG. 2).

After formation of the lower shield, a MR portion 4 for reading is formed as a layer consisting of a spin valve film of NiO, CoO, NiFe, Cu or the like (step S3 of FIG. 2). Thereafter, in order to form a gap layer, an insulation layer 5 of a predetermined thickness of alumina or the like is formed (step S4 of FIG. 2).

A soft magnetic material layer of permalloy or the like is formed by sputtering or plating. The soft magnetic material layer thus formed serves as a common pole (lower magnetic material layer) 6 (step S5 of FIG. 2). Over the common pole 6, a negative type photoresist 7 containing 0.1 to 5% of 1,1-bis[p-chlorophenyl]-2,2,2-trichloroethane, its isomer, analogue, homologue and residual compound which has maximum absorption around 250 nm, is applied by a spin coating method (S6 of FIG. 2).

Here, the residual compound is a substance generated during synthesis of a synthetic compound of a halogenated organic substance (1,1-bis p-chlorophenyl or the like).

Also, as other negative type photoresist, negative type resin containing 1,2,5,6,9,10-hexabromocyclododecane, 1,10-dichlorododecane, 1,1-bis[p-chlorophenyl]-2,2-dichloroethane, 1,1-bis[p-chlorophenyl]-2,2 dichloroethylene, 1,2,3,4,5,6-hexachlorocyclohexane and the like, may be used.

On the negative type photoresist 7, a predetermined insulation layer pattern mask 9a is set (step S7 of FIG. 2). Via the insulation layer pattern mask 9a (not shown), light is irradiated on the negative type photoresist 7 to perform patterning. Then, the negative type photoresist 7 at the portion other than that to be left as the interlayer insulation layer is etched by the developer (step S8 of FIG. 2). Subsequently, heat treatment is performed at a temperature lower than or equal to 200° C. under inert gas atmosphere to form the interlayer insulation layer as the hard-baked negative type photoresist (S9 of FIG. 2).

Subsequently, by way of plating, a coil 8 is formed (step S10 of FIG. 2). At this time, in order to eliminate step by the coil 8, the foregoing negative type photoresist 7 is applied by way of spin coating (step 11 of FIG. 2).

On negative type photoresist 7, a predetermined insulation layer pattern mask 9b (insulation layer pattern mask 9 of FIG. 1) is set (step S12 of FIG. 2). By irradiating light on the negative type photoresist 7 via the insulation pattern mask 9b, patterning is performed. Then, the negative type photoresist 7 at the portion other than that to be left as the interlayer insulation layer is etched by a developer (step S13 of FIG. 2). Thereafter, heat treatment is performed at a temperature lower than or equal to 200° C. under inert gas atmosphere to form the interlayer insulation layer as hard-baked negative type photoresist (step S14 of FIG. 2).

It should be noted that the insulation layer pattern mask 9a to be set at step S7 and the insulation layer pattern mask 9b to be set at step S12 are different from each other. In patterning using these insulation layer pattern masks 9a and 9b, the interlayer insulation layer is formed to a predetermined angle of apex in the direction of section. Also, the foregoing steps S10 to S14 are repeated depending upon the number of levels of coils 8 to be formed. Namely, in the case of two levels, the foregoing process steps are repeated twice, and if three levels, the steps are repeated for three times.

Once the interlayer insulation layer is formed, an upper magnetic material layer 10 is formed in the similar manner to that for forming the common pole 6. Furthermore, by forming the protective layer (not shown) of alumina layer thereover (step S15 of FIG. 2) a composite magnetic head structure is formed.

Figure 3:
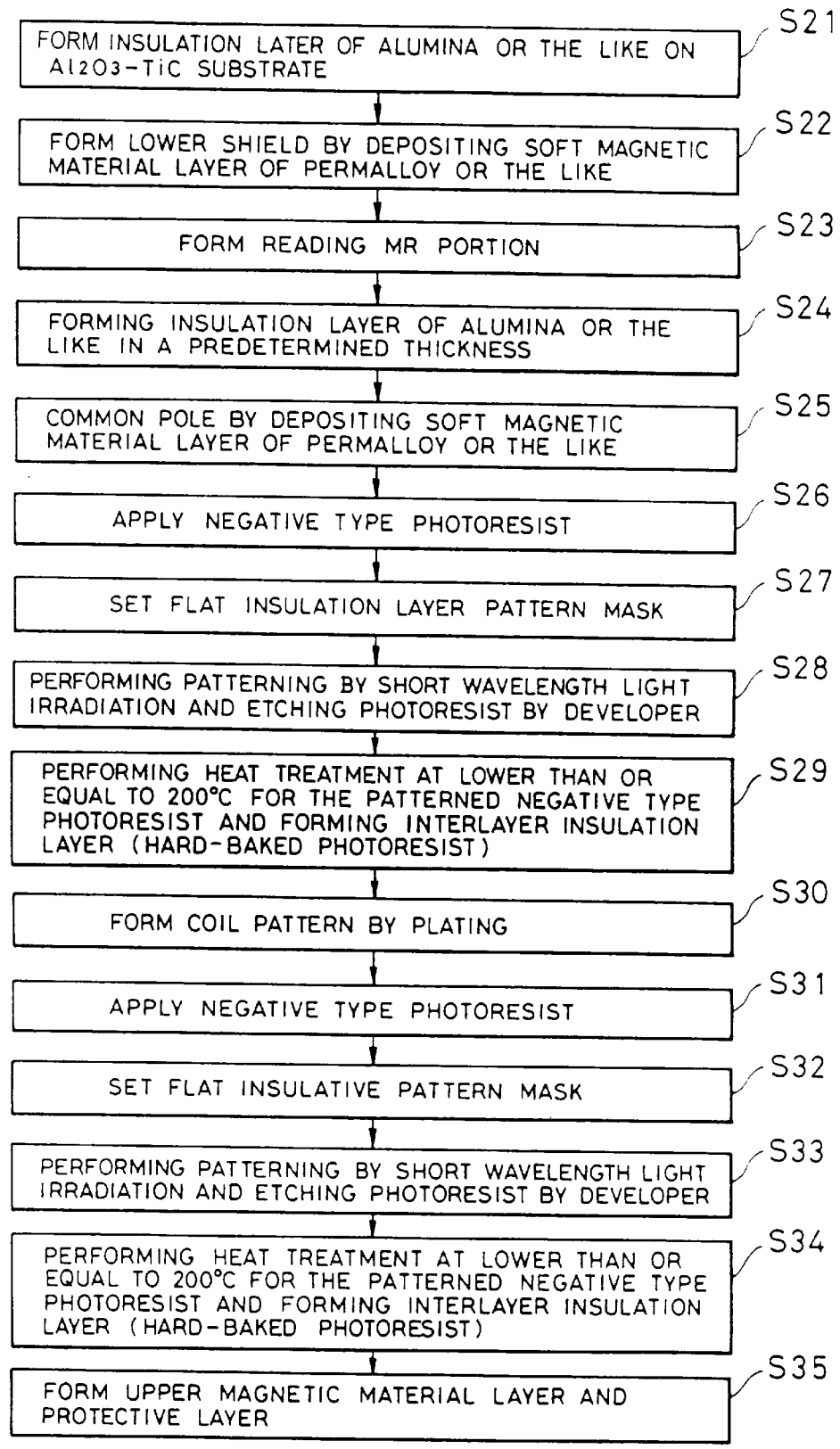
FIG. 3 is an illustration showing another embodiment of a fabrication process of the thin film magnetic head according to the present invention.

FIG. 3 is an illustration showing another embodiment of the fabrication process of the thin film magnetic head according to the present invention.

At first, an insulation layer of alumina or the like is formed on an $Al_2O_3$—TiC substrate by way of sputtering or other appropriate method (step S21 in FIG. 3). Then, a soft magnetic material layer of permalloy or the like is deposited by way of sputtering, plating or so forth to form a lower shield (step S22 of FIG. 3).

After formation of the lower shield, a MR portion for reading is formed as a layer consisting of a spin valve film of NiO, CoO, NiFe, Cu or the like (step S23 of FIG. 3). Thereafter, in order to form a gap layer, an insulation layer of a predetermined thickness of alumina or the like is formed (step S24 of FIG. 3).

A soft magnetic material layer of permalloy or the like is formed by sputtering or plating as a common pole (step S25 of FIG. 3). Over the common pole, a negative type photoresist containing 0.1 to 5% of 1,1-bis[p-chlorophenyl]-2,2, 2-trichloroethane, its isomer, analogue, homologue and residual compound which has maximum absorption around 250 nm, is applied by a spin coating method (step S26 of FIG. 3).

On the negative type photoresist, a predetermined flat insulation layer pattern mask is set (step S27 of FIG. 3). Via the insulation layer pattern mask, an electron beam, light having a short wavelength from a high pressure mercury lamp or a wide range wavelength light is irradiated on the negative type photoresist to perform patterning. Then, the negative type photoresist at the portion other than that to be left as the interlayer insulation layer is etched by the developer (step S28 of FIG. 3). Subsequently, heat treatment is performed at a temperature lower than or equal to 200° C. under inert gas atmosphere to form the interlayer insulation layer as the hard-baked negative type photoresist (step S29 of FIG. 3).

Subsequently, by way of plating, a coil is formed (step S30 of FIG. 3). At this time, in order to eliminate step by the coil, the foregoing negative type photoresist is applied by way of spin coating (step S31 of FIG. 3).

On the negative type photoresist, a predetermined insulation layer pattern mask is set (step S32 of FIG. 3). By irradiating light on the negative type photoresist via the insulation pattern mask, patterning is performed. Then, the negative type photoresist at the portion other than that to be left as the interlayer insulation layer is etched by a developer (step S33 of FIG. 3). Thereafter, heat treatment is performed at a temperature lower than or equal to 200° C. under inert gas atmosphere to form the interlayer insulation layer as the hard-baked negative type photoresist (step S34 of FIG. 3).

It should be noted that the insulation layer pattern mask to be set at step S27 and the insulation layer pattern mask to be set at step S32 are different from each other. In patterning using these insulation layer pattern masks, the interlayer insulation layer is formed at a predetermined angle of apex in the direction of the section. Also, the foregoing steps S30 to S34 are repeated depending upon the number of levels of coils 8 to be formed. Namely, in case of two levels, the foregoing process steps are repeated twice, and if three levels, the steps are repeated for three times.

Once the interlayer insulation layer is formed, an upper magnetic material layer 10 is formed in the similar manner to that for forming the common pole. Furthermore, by forming the protective layer (not shown) of alumina layer thereover (step S35 of FIG. 3) a composite magnetic head structure is formed.

Figure 4:
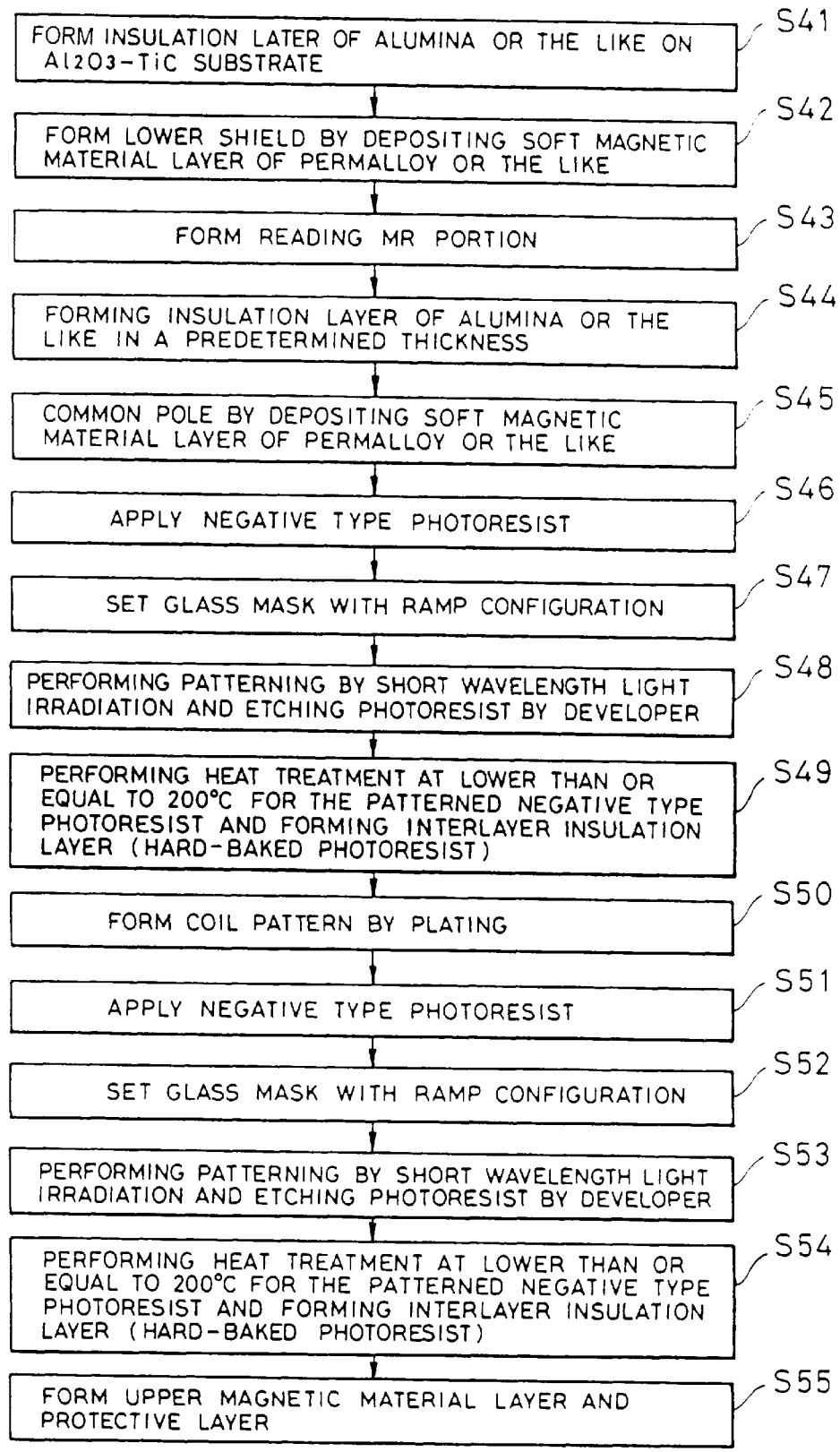
FIG. 4 is an illustration showing a further embodiment of a fabrication process of the thin film magnetic head according to the present invention.
Figure 5A:
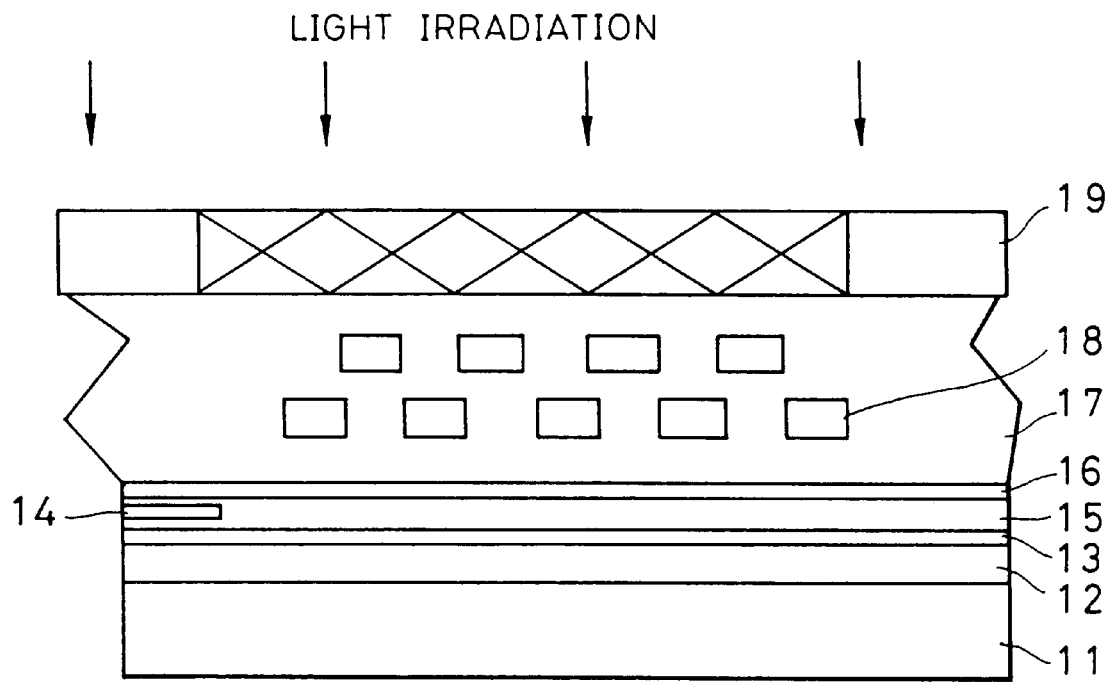
FIG. 5A is an illustration showing a process of light irradiation to a photoresist in the prior art.
Figure 5B:
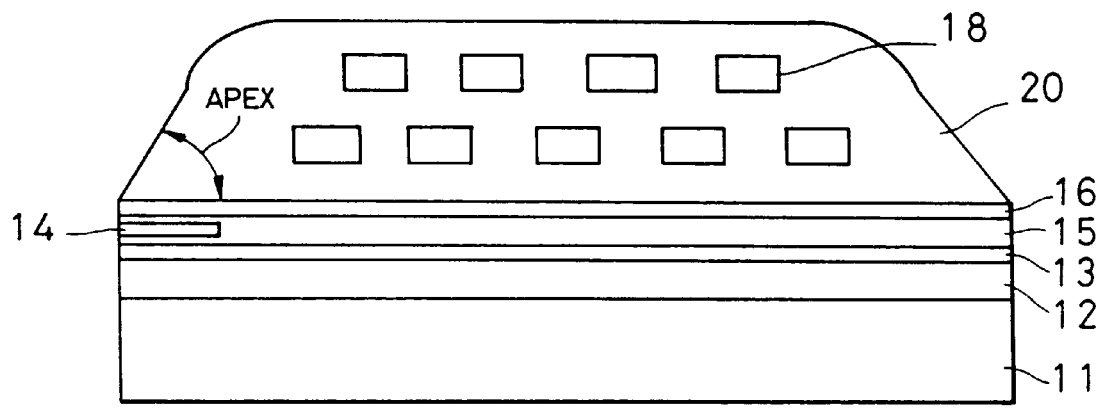
FIG. 5B is an illustration showing a process for forming the interlayer insulation layer by performing heat treatment for the photoresist.

FIG. 4 shows a further embodiment of the fabrication process of the thin film magnetic head according to the present invention. A further embodiment of the fabrication process of the thin film magnetic head according to the present invention will be discussed with reference to FIG. 4.

When a further embodiment of the thin film magnetic head is to be fabricated, at first, an insulation layer of alumina or the like is formed on an $Al_2O_3$—TiC substrate by way of sputtering or other appropriate method (step S41 in FIG. 4). Then, a soft magnetic material layer of permalloy or the like is deposited by way of sputtering, plating or so forth to form a lower shield (step S42 of FIG. 4).

After formation of the lower shield, a MR portion for reading is formed as a layer consisting of a spin valve film of NiO, CoO, NiFe, Cu or the like (step S43 of FIG. 4). Thereafter, in order to form a gap layer, an insulation layer of a predetermined thickness of alumina or the like is formed (step S44 of FIG. 4).

A soft magnetic material layer of permalloy or the like is formed by sputtering or plating to form a common pole (step S45 of FIG. 4). Over the common pole, a negative type photoresist containing 0.1 to 5% of 1,1-bis[p-chlorophenyl]-2,2,2-trichloroethane, its isomer, analogue, homologue and residual compound is applied by a spin coating method (S46 of FIG. 4).

On the negative type photoresist, a glass mask having a predetermined ramp configuration is depressed onto the negative type photoresist to set thereon (step S47 of FIG. 4). In this case, the glass mask has a ramp configuration (transfer pattern) so as to establish a predetermined angle of apex in the direction of the section (see insulation layer pattern mask 9 of FIG. 1). On the other hand, since the negative type photoresist is not yet cured by irradiation of the light, it can be depressed with a predetermined depression force.

Via the insulation layer pattern mask, an electron beam, light having a short wavelength from a high pressure mercury lamp or a wide range wavelength light is irradiated on the negative type photoresist to perform patterning. Then, the negative type photoresist at the portion other than that to be left as the interlayer insulation layer is etched by the developer (step S48 of FIG. 4). Subsequently, heat treatment is performed at a temperature lower than or equal to 200° C. under inert gas atmosphere to form the interlayer insulation layer as the hard-baked negative type photoresist (S49 of FIG. 4).

Subsequently, by way of plating, a coil is formed (step S50 of FIG. 4). At this time, in order to eliminate step by the coil, the foregoing negative type photoresist is applied by way of spin coating (step 51 of FIG. 4).

On the negative type photoresist, a glass mask having a predetermined ramp configuration is depressed onto the negative type photoresist to set thereon (step S52 of FIG. 4). By irradiating light on the negative type photoresist via the glass mask, patterning is performed. Then, the negative type photoresist at the portion other than that to be left as the interlayer insulation layer is etched by a developer (step S53 of FIG. 4). Thereafter, heat treatment is performed at a temperature lower than or equal to 200° C. under inert gas atmosphere to form the interlayer insulation layer as hard-baked negative type photoresist (step S54 of FIG. 4).

It should be noted that the insulation later pattern mask to be set at step S47 and the insulation layer pattern mask to be set at step S52 are different from each other. In patterning using these insulation layer pattern masks, the interlayer insulation layer is formed at a predetermined angle of apex in the direction of the section. Also, the foregoing steps S50 to S54 are repeated depending upon the number of levels of coils to be formed. Namely, in case of two levels, the foregoing process steps are repeated twice, and if three levels, the steps are repeated for three times.

Once the interlayer insulation layer is formed, an upper magnetic material layer 10 is formed in the similar manner to that for forming the common pole. Furthermore, by forming the protective layer of alumina layer thereover (step S55 of FIG. 4) a composite magnetic head structure is formed.

As set forth above, by employing the negative type photoresist 7 cured by irradiation of the light on the hard-baked photoresist disposed between the lower magnetic material layer (common pole 6) and the upper magnetic material layer forming the magnetic circuit together with the coil 8, the interlayer insulation layer having improved bridging density can be obtained. As a result, it becomes possible to obtain the interlayer insulation layer which may have smaller thermal expansion and shrinking variation after curing.

On the other hand, by enabling low temperature heat treatment at a temperature lower than or equal to 200° C. which is much lower than the conventional heat treatment temperature of higher than or equal to 250° C., a spin valve heat material which has not been possible to employ in the prior art, becomes possible to employ.

Furthermore, the heat treatment can be performed at a lower temperature than that in the prior art, throughput of the process can be improved to permitting lowering of the cost. Therefore, even when low temperature heat treatment is employed, satisfactory characteristics as the interlayer insulation layer can be obtained. Consequently, throughput of the process can be improved.

Namely, in the present invention, in order to obtain satisfactory characteristics of the interlayer insulation layer even when low temperature heat treatment at a temperature lower than or equal to 200° C. for the photoresist, and sufficiently cure the interlayer insulation layer, a device employing a broader wavelength source containing shorter wavelength than the wavelength of the light to be irradiated under normal exposure condition (high power ultraviolet ray irradiation device) is used for promoting curing.

Normally, there are two types, i.e. positive type and negative type photoresist. In the positive type photoresist, the portion irradiated by the light is removed by the developer. In contrast to this, in the negative type photoresist, the portion not irradiated by the light is removed by the developer.

On the other hand, the bridging density of the photoresist can be improved by irradiation of the light. However, in case of the positive photoresist, irradiation of light has to be performed again to attain this effect at a cost of increasing process steps. Furthermore, in this case a not so remarkable effect on improvement of the bridging density is attainable.

In contrast to this, since the present invention employs the negative type photoresist, among the interlayer insulation layer, light may be irradiated only to the necessary portion and the portion not irradiated by the light is removed by the developer. Therefore, it is not necessary to perform light irradiation again for improvement of the bridging density.

Therefore, throughput of the process can be improved. Furthermore, since the heat treatment of the negative type photoresist can be performed a low temperature set to be lower than or equal to 200° C., the spin valve head material which has insufficient stability versus temperature can be employed. Therefore, even though the low temperature heat treatment is employed, sufficient characteristics as the interlayer insulation layer can be obtained.

As set forth above, according to the present invention, by employing the negative type photoresist which is cured by irradiation of the light is employed in the hard-baked negative type photoresist to be disposed between the lower and upper magnetic material layers forming the magnetic circuit, together with the coil, sufficient characteristics as the interlayer insulation layer can be obtained even when the low temperature head treatment is employed to improve the process throughput.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A fabrication process for a thin film magnetic head having a structure in which a coil and a hard-baked photoresist are disposed between a lower magnetic material layer and an upper magnetic material layer, said process comprising:

forming a lower magnetic material layer;
   applying a first negative photoresist which is cured by irradiation of a light on said lower magnetic material layer;
   irradiating a light on said first negative photoresist through a preliminarily set mask;
   performing a heat treatment for said first negative photoresist by irradiation of light to form a first portion of said hard-baked negative photoresist;
   forming said coil on said first portion of said hard-baked negative photoresist;
   applying a second negative photoresist on said coil;
   setting an insulation pattern layer mask on said second negative photoresist;
   irradiating a light on said second negative photoresist via said insulating pattern layer mask;
   performing a heat treatment for said second negative photoresist by irradiation of light to form a second portion of said hard-baked photoresist; and
   forming said upper magnetic material layer on said hard-baked negative photoresist.

2. A fabrication process of a thin film magnetic head as set forth in claim 1, wherein at least one of said first negative photoresist and second negative photoresist layers contains at least one of 0.1 to 5% of 1,1-bis[p-chlorophenyl]-2,2,2-trichloroethane, its isomer, analogue, homologue and residual compound which has maximum absorption around 250 nm.

3. A fabrication process of a thin film magnetic head as set forth in claim 2, wherein each of said negative photoresists is irradiated by light employing at least one of an electron beam, light having a short wavelength from a high pressure mercury lamp, and a light of wide range wavelength.

4. A fabrication process of a thin film magnetic head as set forth in claim 2, wherein said second negative photoresist is subjected to irradiation of light following depressing said insulation pattern layer mask on said second negative photoresist, said mask having a transfer pattern to form the apex of said hard-baked photoresist to have a predetermined angle.

5. A fabrication process for a thin film magnetic head as set forth in claim 1, wherein said heat treatments are performed at a temperature not greater than 200° C.

6. A fabrication process for a thin film magnetic head having a structure, in which a coil and a hard-baked photoresist are disposed between a lower magnetic material layer and an upper magnetic material layer, said process comprising:

forming a lower magnetic material layer;
   applying a first negative photoresist which is cured by irradiation of a light on said lower magnetic material layer;
   irradiating a light on said first negative photoresist through a preliminarily set mask;
   performing a heat treatment for said first negative photoresist by irradiation of light to form a first portion of said hard-baked photoresist;
   forming said coil on said first portion of said hard-baked negative photoresist;
   applying a second negative photoresist on said coil;
   setting an insulation pattern layer mask on said second negative photoresist;
   irradiating a light on said second negative photoresist via said insulating pattern layer mask;
   performing a heat treatment for said second negative photoresist by irradiation of light to form a second portion of said hard-baked photoresist; and
   forming said upper magnetic material layer on said hard-baked negative photoresist,
   at least one of said first negative photoresist and said second negative photoresist layers containing one of 1,2,5,6,9,10-hexabromocyclododecane, its isomer, analogue, homologue and residual compound.

7. A fabrication process of a thin film magnetic head as set forth in claim 6, wherein each of said negative photoresists is irradiated by light employing at least one of an electron beam, light having a short wavelength from a high pressure mercury lamp, and a light of wide range wavelength.

8. A fabrication process of a thin film magnetic head as set forth in claim 6, wherein said second negative photoresist is subjected to irradiation of light following depressing said insulation pattern layer mask on said second photoresist, said mask having a transfer pattern to form the apex of said hard-baked photoresist to have a predetermined angle.

9. A fabrication process for a thin film magnetic head as set forth in claim 6, wherein said heat treatments are performed at a temperature not greater than 200° C.

10. A fabrication process for a thin film magnetic head having a structure, in which a coil and a hard-baked negative photoresist are disposed between a lower magnetic material layer and an upper magnetic material layer, said process comprising:

forming a lower magnetic material layer;

applying a first negative photoresist which is cured by irradiation of a light on said lower magnetic material layer;

irradiating a light on said first negative photoresist through a preliminarily set mask;

performing a heat treatment for said first negative photoresist by irradiation of light to form a first portion of said hard-baked photoresist;

forming said coil on said first portion of said hard-baked negative photoresist;

applying a second negative photoresist on said coil;

setting an insulation pattern layer mask on said second negative photoresist;

irradiating a light on said second negative photoresist via said insulating pattern layer mask;

performing a heat treatment for said second negative photoresist by irradiation of light to form a second portion of said hard-baked photoresist; and forming said upper magnetic material layer on said hard-baked negative photoresist, at least one of said first negative photoresist and said second negative photoresist layers containing one of 1,10-dichlorododecane, its isomer, analogue homologue and residual compound.

11. A fabrication process of a thin film magnetic head as set forth in claim 10, wherein each of said negative photoresists is irradiated by light employing at least one of an electron beam, light having a short wavelength from a high pressure mercury lamp, and a light of wide range wavelength.

12. A fabrication process of a thin film magnetic head as set forth in claim 10, wherein said second negative photoresist is subjected to irradiation of light following depressing said insulation pattern layer mask on said second negative photoresist, said mask having a transfer pattern to form the apex of said hard-baked photoresist to have a predetermined angle.

13. A fabrication process for a thin film magnetic head as set forth in claim 10, wherein said heat treatments are performed at a temperature not greater than 200° C.

14. A fabrication process for a thin film magnetic head having a structure, in which a coil and a hard-baked negative photoresist are disposed between a lower magnetic material layer and an upper magnetic material layer, said process comprising:

forming a lower magnetic material layer;

applying a first negative photoresist which is cured by irradiation of a light on said lower magnetic material layer;

irradiating a light on said first negative photoresist through a preliminarily set mask;

performing a heat treatment for said first negative photoresist by irradiation of light to form a first portion of said hard-baked photoresist;

forming said coil on said first portion of said hard-baked negative photoresist;

applying a second negative photoresist on said coil;

setting an insulation pattern layer mask on said second negative photoresist;

irradiating a light on said negative photoresist via said insulating pattern layer mask;

performing a heat treatment for said negative photoresist by irradiation of light to form a second portion of said hard-baked photoresist; and forming said upper magnetic material layer on said hard-baked negative photoresist, at least one of said first negative photoresist and said second negative photoresist layers containing 1,2,3,4,5,6-hexachlorocyclohexane, its isomer, analogue homologue and residual compound.

15. A fabrication process of a thin film magnetic head as set forth in claim 14, wherein each of said negative photoresists is irradiated by light employing at least one of an electron beam, light having a short wavelength from a high pressure mercury lamp, and a light of wide range wavelength.

16. A fabrication process of a thin film magnetic head as set forth in claim 14, wherein said second negative photoresist is subjected to irradiation of light following depressing said insulation pattern layer mask on said second negative photoresist, said mask having a transfer pattern to form the apex of said hard-baked photoresist to have a predetermined angle.

17. A fabrication process for a thin film magnetic head as set forth in claim 14, wherein said heat treatments are performed at a temperature not greater than 200° C.

18. A fabrication process for a thin film magnetic head having a structure, in which a coil and a hard-baked negative photoresist are disposed between a lower magnetic material layer and an upper magnetic material layer, said process comprising:

forming a lower magnetic material layer;

applying a first negative photoresist which is cured by irradiation of a light on said lower magnetic material layer;

irradiating a light on said first negative photoresist through a preliminarily set mask;

performing a heat treatment for said first negative photoresist by irradiation of light to form a first portion of said hard-baked photoresist;

forming said coil on said hard-baked negative photoresist;

applying a second negative photoresist on said coil setting an insulation pattern layer mask on said second negative photoresist irradiating a light on said second negative photoresist via said insulating pattern layer mask;

performing a heat treatment for said negative photoresist by irradiation of light to form a second portion of said hard-baked photoresist; and forming said upper magnetic material layer on said hard-baked negative photoresist, at least one of said first negative photoresist and said second negative photoresist layers containing one of 1,1-bis[p-chlorophenyl]-2,2-dichloroethane, its isomer, analogue homologue and residual compound.

19. A fabrication process of a thin film magnetic head as set forth in claim 18, wherein each of said negative photoresists is exposed by irradiation of light employing at least one of an electron beam, light having a short wavelength from a high pressure mercury lamp, and a light of wide range wavelength.

20. A fabrication process of a thin film magnetic head as set forth in claim 18, wherein said second negative photoresist is subjected to irradiation of light following depressing said insulation pattern layer mask on said second negative photoresist, said mask having a transfer pattern to form the apex of said hard-baked photoresist to have a predetermined angle.

21. A fabrication process for a thin film magnetic head as set forth in claim 18, wherein said heat treatment are performed at a temperature not greater than 200° C.

22. A fabrication process for a thin film magnetic head having a structure, in which a coil and a hard-baked negative photoresist are disposed between a lower magnetic material layer and an upper magnetic material layer, said process comprising:

forming a lower magnetic material layer;

applying a first negative photoresist which is cured by irradiation of a light on said lower magnetic material layer;

irradiating a light on said first negative photoresist through a preliminarily set mask;

performing a heat treatment for said first negative photoresist by irradiation of light to form a first portion of said hard-baked photoresist;

forming said coil on said first portion of said hard-baked negative photoresist;

applying a second negative photoresist on said coil;

setting an insulation pattern layer mask on said second negative photoresist;

irradiating a light on said second negative photoresist via said insulating pattern layer mask;

performing a heat treatment for said second negative photoresist by irradiation of light to form a second portion of said hard-baked photoresist; and forming said upper magnetic material layer on said hard-baked negative photoresist, at least one of said first negative photoresist and said second negative photoresist layers containing 1,1-bis [p-chlorophenyl]-2,2-dichloroethylene, its isomer, analogue homologue and residual compound.

23. A fabrication process of a thin film magnetic head as set forth in claim 22, wherein each of said negative photoresists is irradiated by light employing at least one of an electron beam, light having a short wavelength from a high pressure mercury lamp, and a light of wide range wavelength.

24. A fabrication process of a thin film magnetic head as set forth in claim 22, wherein said second negative photoresist is subjected to irradiation of light following depressing said insulation pattern layer mask on said second negative photoresist, said mask having a transfer pattern to form the apex of said hard-baked photoresist to have a predetermined angle.

25. A fabrication process for a thin film magnetic head as set forth in claim 22, wherein said heat treatments are performed at a temperature not greater than 200° C.

* * * * *

UNITED STATES PATENT AND TRADEMARK OFFICE
CERTIFICATE OF CORRECTION

PATENT NO. : 6,107,005
DATED : August 22, 2000
INVENTOR(S) : Mikiko SAITO

It is certified that error appears in the above-identified patent and that said Letters Patent is hereby corrected as shown below:

Column 4, line 55, delete "heal" and insert --heat--

Column 10, line 16, delete "2" and insert --39--

Signed and Sealed this

Fifteenth Day of May, 2001

Attest:

NICHOLAS P. GODICI

Attesting Officer

Acting Director of the United States Patent and Trademark Office